US005495208A

United States Patent [19]
Gonzalez et al.

[11] Patent Number: 5,495,208
[45] Date of Patent: Feb. 27, 1996

[54] WIDE BAND TUNABLE AND MODULATABLE REFERENCE OSCILLATOR

[75] Inventors: Armando J. Gonzalez, Miami, Fla.; Kenneth D. Cornett, Albuquerque, N.M.; Jaime A. Borras, Hialeah, Fla.

[73] Assignee: Motorola, Inc., Schaumburg, Ill.

[21] Appl. No.: 226,514

[22] Filed: Apr. 4, 1994

[51] Int. Cl.$^6$ ................................ H03B 5/32; H04B 1/26
[52] U.S. Cl. .................... 331/158; 332/136; 455/258; 455/318
[58] Field of Search .................. 455/195.1, 196.1, 455/197.2, 120, 124, 125, 255, 257, 258, 259, 261, 262, 264, 169.1, 169.2, 265, 193.1, 193.2, 318; 331/116 R, 116 FE, 177 V, 158; 332/136

[56] References Cited

U.S. PATENT DOCUMENTS

| | | | |
|---|---|---|---|
| 3,878,408 | 4/1975 | Nemoto | 310/8.1 |
| 3,991,378 | 10/1975 | Buchanan | 331/116 R |
| 4,630,008 | 12/1986 | Weeks | 322/167 |
| 4,801,898 | 1/1989 | Obayashi | 331/132 |
| 4,827,226 | 5/1989 | Connell | 331/116 FE |
| 4,851,791 | 7/1989 | Marotel | 331/158 |
| 4,851,792 | 7/1989 | Ochiai et al. | 331/176 |
| 5,107,522 | 4/1992 | Kitayama et al. | 375/97 |
| 5,173,835 | 12/1992 | Cornett et al. | 257/310 |

FOREIGN PATENT DOCUMENTS 0099008  6/1983  Japan ................. 331/116 R

Primary Examiner—Reinhard J. Eisenzopf
Assistant Examiner—Lee Nguyen
Attorney, Agent, or Firm—Rolland R. Hackbart; John G. Rauch; John J. King

[57] ABSTRACT

A tuning circuit for a reference oscillator (200) including voltage variable capacitors (222, 224) in a back to back configuration and providing a control terminal for voltage controlled tuning of the reference oscillator (200). Also included in the tuning circuit is a modulation bias circuit for modulating the reference oscillator (200).

8 Claims, 3 Drawing Sheets

WIDE BAND TUNABLE AND MODULATABLE REFERENCE OSCILLATOR

TECHNICAL FIELD

This invention relates to electronic circuits, and more specifically to a tuning circuit using voltage variable capacitors.

BACKGROUND

Reference crystal oscillators are typically tuned using variable capacitors or varactor diodes, however oscillators designed with capacitors or varactors do not provide sufficient frequency variation with small variations in bias voltage. Communications products, such as DECT (Digital European Cordless Telephone) and CT-2 (Cordless Telephone Second Generation), continue to reduce their operating supply voltages in an effort to reduce current drain and reduce the number of battery cells required for operation of portable electronic devices. The varactor diode characteristics over temperature at low bias voltage exhibit larger variation than at high bias voltage causing large changes in oscillator frequency. Large signal amplitudes can forward bias the varactor diode and must be avoided in these circuits. Hence, there is a need for an improved frequency tuning circuit that can operate at low voltages while maintaining good temperature performance over a wide frequency tuning bandwidth.

DETAILED DESCRIPTION OF THE PREFERRED EMBODIMENT

Figure 1:
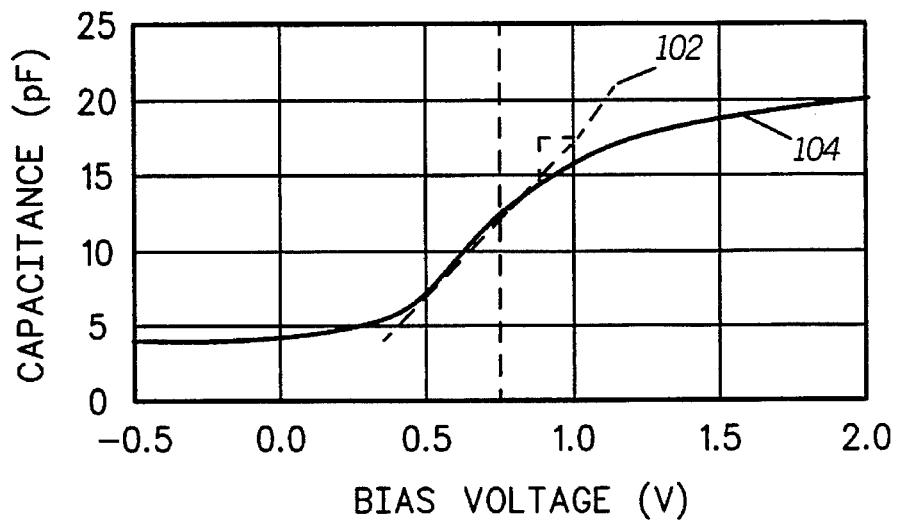
FIG. 1 is a graph showing capacitance versus DC bias voltage of a voltage variable capacitor.

A voltage variable capacitor (VVC) is a variable impedance device which exhibits a very large variation in capacitance versus voltage. Capacitance variation in the order of 50 to 1 can be exhibited in a VVC from the low to the high bias voltage settings. Referring to FIG. 1, a linear approximation of the capacitance versus bias (C-V) curve 104 about an operating point "Co" (e.g. 12 pico-farads), is shown in line 102.

Figure 2:
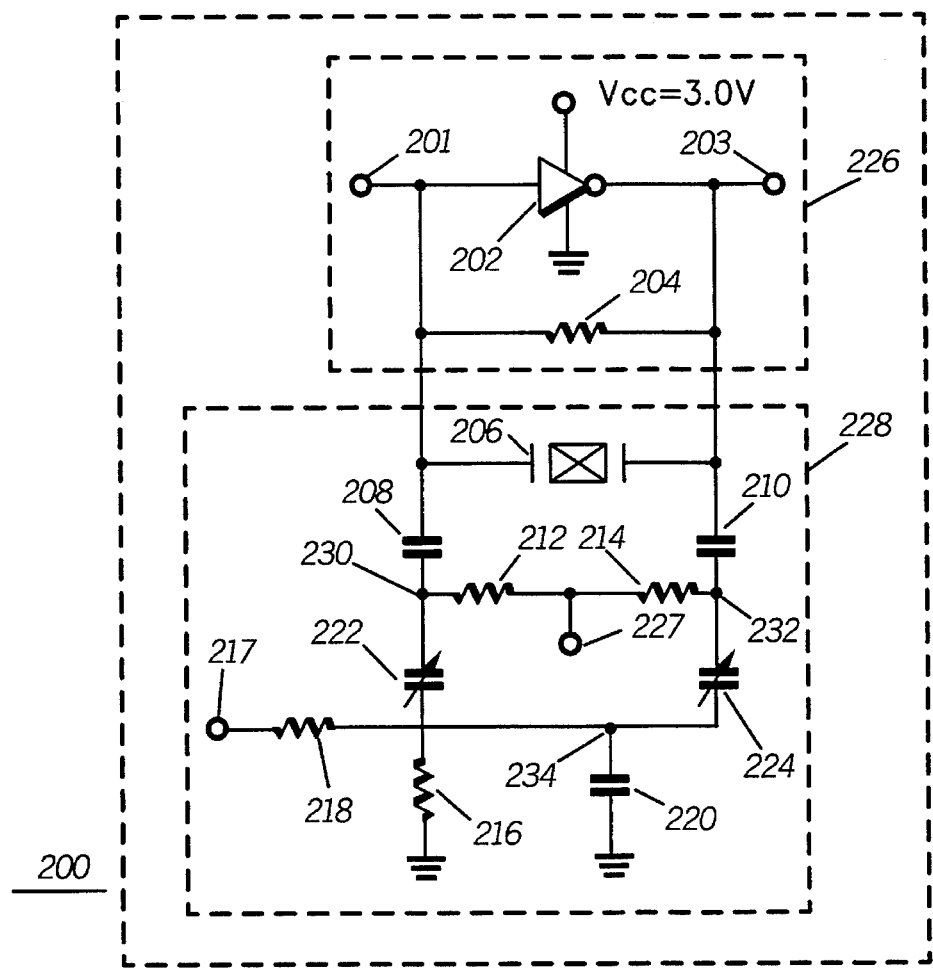
FIG. 2 is a drawing of a Pierce oscillator circuit employing a tuning circuit in accordance with the present invention.

A first embodiment of a tuning circuit for a reference oscillator in a Pierce oscillator configuration, is shown in FIG. 2. The reference oscillator circuit 200 is comprised of an amplifier circuit 226, having an input 201 and an output, 203 and a resonant circuit 228 coupled to the amplifier's 201 input and output 203. The operating supply for the reference oscillator 200 is preferably set at 3 V. The amplifier circuit 226 is comprised of an inverter 202 and a feedback resistor 204 coupled in parallel to the inverter. The resonant circuit 228 includes a resonator element 206 having a first and second terminal and biasing circuitry to act as a tuning means for the reference oscillator 200. The biasing circuitry comprises two DC blocking capacitors 208 and 210 each having a terminal coupled to either the first or second terminal of the resonator element 206. The biasing circuitry further comprises two resistors 212 and 214 coupled in series across the two opposite terminals of capacitors 208 and 210. The connection between capacitor 208 and resistor 212 will be known as first node 230, and the connection between capacitor 210 and resistor 214 will be known as second node 232. The resonator element 206, in the preferred embodiment, is a quartz crystal.

The resonant circuit 228 also includes two voltage variable capacitors 222, 224 coupled in a back to back configuration, each having a positive and negative terminal, as part of the tuning circuit for the reference oscillator 200. The positive terminal of the first VVC 222 is coupled to the capacitor 208 at first node 230, and the positive term Anal of the second VVC 224 is coupled to the capacitor 210 at second node 232. The two resistors 212 and 214, now connected in series across the two positive terminals of the VVCs 222 and 224, provide isolation between the two VVCs. A control terminal 227 is located between the series connection of resistors 212 and 214 and can be controlled by a DC voltage, such as a control signal from a digital-to-analog converter (DAC) under microprocessor control (not shown). The control terminal 227 sets the nominal operating frequency of the oscillator 200 thus providing voltage controlled frequency tuning, or dynamic control, by controlling the capacitance change in the first and second VVCs 222, 224. The negative terminals of the first and second VVCs 222 and 224 are coup led together at node 234 completing the back to back configuration.

Also included in the tuning circuit is a modulation bias circuit which includes a voltage divider network of two resistors 216, 218, and a capacitor 220 for frequency modulating the reference oscillator 200. The resistor 216 and capacitor 220 are coupled in parallel with one set of terminals coupled to the negative terminals of VVCs 222 and 224 while the other set of terminals is coupled to ground potential. The capacitor 220 provides an AC path to ground potential. Resistor 218 has one terminal coupled to the negative terminals of VVCs 222 and 224, and the other terminal acts as an input for receiving a frequency modulating signal. The voltage divider network provides a biasing voltage to a reference point located at node 234 where the negative terminals the first and second VVCs 222, 224 are coupled together. This biasing voltage optimizes the circuit tuning and modulation performance with respect to the VVC characteristics as shown in FIG. 1.

The circuit implementation of FIG. 2 simultaneously biases both VVCs 222 and 224. The desired modulating signal may be introduced at either the control terminal 227 or the modulation input 217 of the modulation bias circuit. However, in the preferred embodiment of the invention, the modulation bias circuit input 217 is used for the entry point of the frequency modulating signal to allow the control terminal 227 to be controlled by the output of the DAC under microprocessor control.

Frequency modulation of the reference oscillator 200 may also be accomplished by injecting the modulating signal to the control terminal 227 and tying the negative terminals of the first and second VVCs 222, 224 to ground potential.

Figure 3:
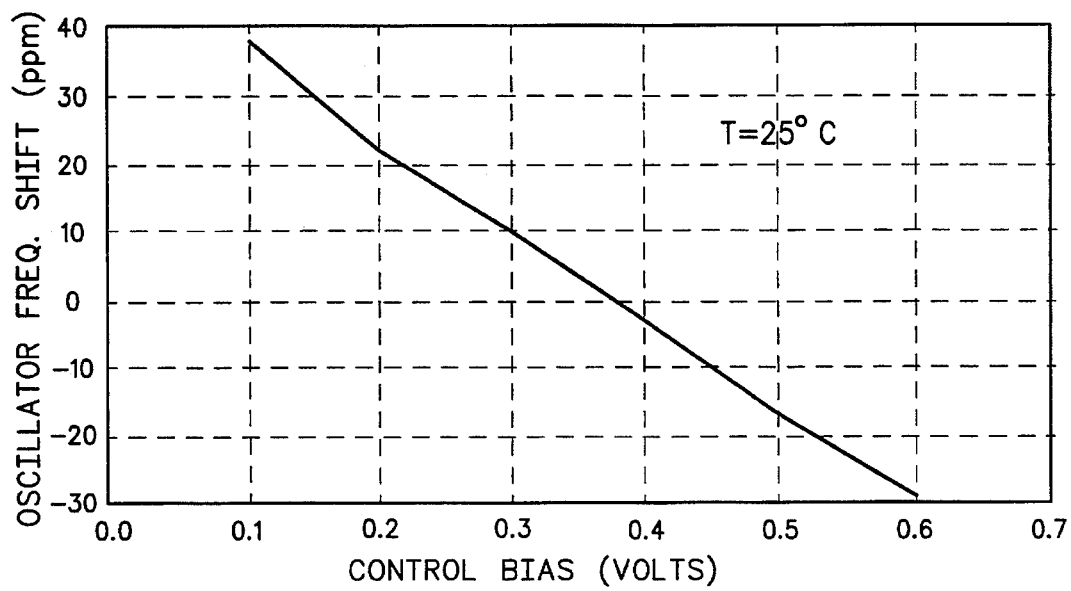
FIG. 3 is a graph of oscillator frequency shift versus control bias voltage for a VVC in the Pierce oscillator circuit of FIG. 2.
Figure 4:
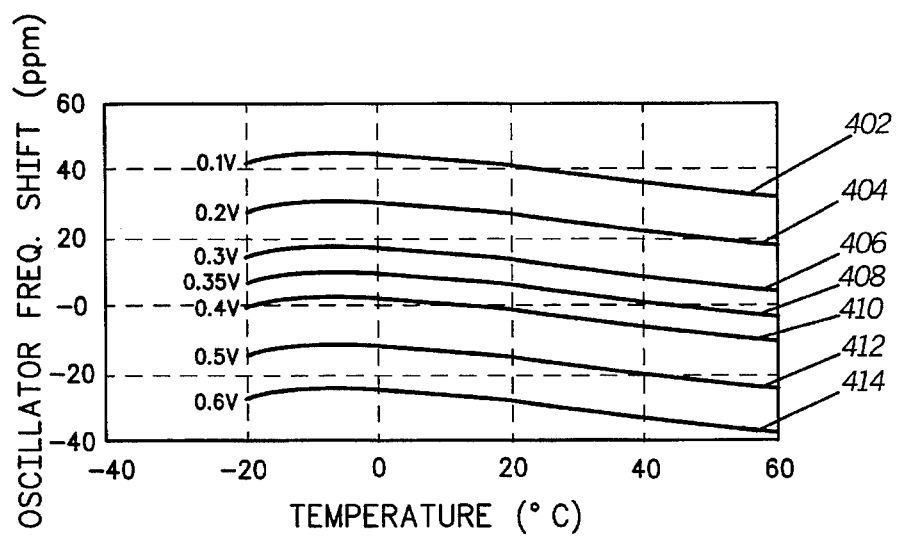
FIG. 4 is a graph of oscillator frequency shift over temperature versus control bias voltage for a VVC in the Pierce oscillator circuit of FIG. 2.

A graph illustrated in FIG. 3 shows the change of output frequency in parts per million (ppm) of the Pierce oscillator circuit 200 with respect to the change in control bias voltage at the control terminal 227. A control bias voltage change of 0.5 V will change the oscillator output frequency over 60 ppm, thus providing a large resonance frequency tuning range with small bias voltage variation. This frequency variation range, or tuning bandwidth, exhibits high linear characteristics. The temperature performance (limited primarily by the stability of the crystal) exhibits repeatable characteristics with little variation as shown in FIG. 4. This is easily observed by superimposing the different control voltage curves 402 through 414 shown in FIG. 4.

The data shown in Table 1 was obtained with a 4.2 MHz crystal employed as the resonator element 206 and a control terminal voltage, $C_V$, resolution equal to 10 mV/step. The nominal frequency of operation was set with a CV of 0.37 volts, and a frequency tuning resolution of 1.35 ppm/step was observed. This resolution is calculated using the following equation:

$$\frac{|(ppm - ppm1)| + |(ppm - ppm2)|}{2}$$

where;

ppm=osc. freq. shift at $C_V$, ppm1=osc. freq. shift at $C_V$+one step, and ppm2=osc. freq. shift at $C_V$-one step.

Using a digital-to-analog converter (DAC), a control voltage tuning resolution less than or equal to 5 mV/step can be obtained to provide even more accurate control of the frequency resolution of the reference oscillator.

TABLE 1

| $C_V$ (V) | f (MHz) | PPM |
|---|---|---|
| 0.1 | 4.200159161 | 37.9 |
| 0.2 | 4.200100272 | 23.9 |
| 0.3 | 4.200041753 | 9.9 |
| 0.32 | 4.20003597 | 8.6 |
| 0.33 | 4.200030294 | 7.2 |
| 0.33 | 4.200024617 | 5.9 |
| 0.34 | 4.200018993 | 4.5 |
| 0.35 | 4.200013688 | 3.2 |
| 0.36 | 4.20000764 | 1.8 |
| 0.37 | 4.200001963 | 0.5 |
| 0.38 | 4.199996286 | −0.9 |
| 0.39 | 4.199990716 | −2.2 |
| 0.4 | 4.1999985145 | −3.5 |
| 0.5 | 4.199929598 | −16.8 |
| 0.6 | 4.199876756 | −29.3 |

Figure 5:
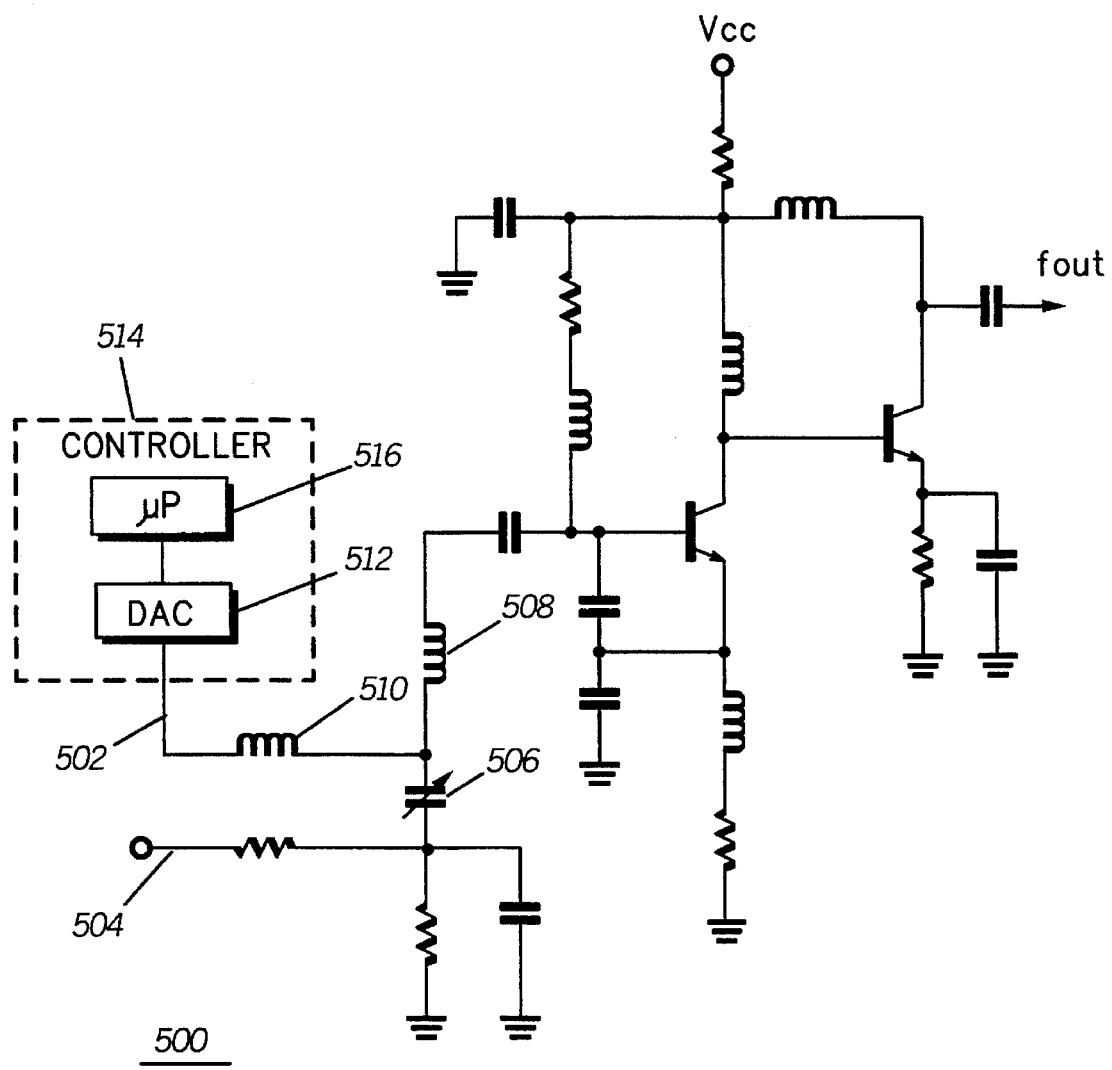
FIG. 5 is a drawing of a section of a radio having a Colpitts oscillator circuit employing a tuning circuit in accordance with the present invention.

Voltage variable capacitors can be used in tuning circuits for other oscillator circuits, as well. Illustrated in FIG. 5 of the accompanying drawings, is a section of a radio 500 configured with a Colpitts oscillator and VVC tuning circuit operating at a supply voltage, Vcc, of preferably 1 volt. A VVC 506 is coupled to a resonator 508 through biasing circuitry, such as an inductor 510. A digital-to-analog converter (DAC) 512, located in controller section 514 and under the control of microprocessor, µP, 516, provides a control signal 502. The control signal 502 gets injected through the inductor 5 10 to the positive terminal of the VVC 506 while the negative terminal of the VVC is coupled to a modulation bias circuit, consisting of a voltage divider. The voltage divider provides an input 504 for receiving a frequency modulating signal and a DC voltage level and biases the negative terminal of the VVC 506 to ensure maximum linear performance tuning of the reference oscillator.

The tuning circuit as described by the present invention provides a reliable method of tuning and maintaining frequency accuracy in reference oscillators. Because of the linear variation of oscillator frequency with bias voltage, the tuning circuit, as described by the invention, eliminates the need for phase modulators in systems such as CT2 or DECT thus reducing current drain. By employing VVCs as a tuning circuit in reference oscillator circuits, accurate tuning is provided, even at low operating voltages, over a wide frequency bandwidth and with excellent temperature performance. Since one or more VVCs can be implemented in a variety of configurations in oscillator circuit designs, the tuning circuit using VVCs provides flexibility in the design of radio circuits.

What is claimed is:

1. A tuning circuit for a reference oscillator, comprising:

a resonator element having a first terminal and a second terminal;

first and second voltage-variable capacitors (VVCs) each having a positive terminal and a negative terminal;

biasing circuitry coupled to the first and second terminals of the resonator element and the positive terminals of the first and second VVCs;

a control terminal, coupled to the first and second terminals of the resonator element and the positive terminals of the first and second VVCs, for receiving a DC voltage to control a capacitance change in the first and second VVCs, such that a nominal frequency of operation for the reference oscillator is set by said DC voltage; and a modulation bias circuit coupled to the negative terminals of the first and second VVCs, and having an input for receiving a frequency modulation signal for frequency modulating the reference oscillator.

2. A tuning circuit for the reference oscillator as defined in claim 1, wherein the negative terminal of the first and second VVCs are coupled to ground potential, and the biasing circuit comprises:

a first resistor and a second resistor coupled in series between the positive terminals of the first and second VVCs, the control terminal being located between the first resistor and the second resistor; and a first DC blocking capacitor and a second DC blocking capacitor coupled between the positive terminals of the first and second VVCs and the first and second terminals of the resonator element, respectively.

3. A tuning circuit as defined in claim 1, wherein the modulation bias circuit comprises:

a voltage divider network for providing the frequency modulating signal to the negative terminals of the first and second VVCs.

4. A reference oscillator, comprising:

an amplifier having an input and an output; and a resonant circuit comprising:

first and second nodes;

a resonator element having first and second terminals, coupled to the input and output of the amplifier, respectively;

a first capacitor coupled between the first terminal of the resonator element and the first node;

a second capacitor coupled between the second terminal of the resonator element and the second node;

first and second resistors coupled in series between the first and second nodes, a control terminal for receiving a control signal being located between the first and second resistors; and first and second voltage variable capacitors (VVCs) each having a positive terminal and a negative terminal, the positive terminal of the first VVC coupled to the first node, the positive terminal of the second VVC coupled to the second node;

a third resistor coupled between ground potential and the negative terminals of the first and second VVCs;

a third capacitor coupled in parallel with the third resistor; and a fourth resistor having a first terminal for providing an input to a modulating signal and a second terminal coupled to the negative terminals of the first and second VVCs.

5. A radio circuit, comprising:

a controller for providing a control signal having a DC voltage;

a reference oscillator comprising:

an amplifier having an input and an output; and a tuning circuit coupled to the amplifier, the tuning circuit comprising:

a resonator element having a first terminal and a second terminal coupled to the input and output of the amplifier, respectively;

first and second voltage variable capacitors (VVCs) each having a positive terminal and a negative terminal;

biasing circuitry coupled to the first and second terminals of the resonator element and the positive terminals of the first and second VVCs;

a control terminal, coupled to the first and second terminals of the resonator element and the positive terminals of the first and second VVCs, for receiving the DC voltage of the control signal to control a capacitance change in the first and second VVCs, such that a nominal frequency of operation for the reference oscillator is set by said DC voltage; and a modulation bias circuit coupled to the negative terminals of the first and second VVCs, and having a input for receiving a frequency modulation signal for frequency modulating the reference oscillator.

6. A radio circuit as defined in claim 5, wherein the negative terminals of the first and second VVCs are coupled to ground potential, and the biasing circuit comprises:

a first resistor and a second resistor coupled in series between the positive terminals of the first and second VVCs, the control terminal being located between the first resistor and the second resistor; and a first DC blocking capacitor and a second DC blocking capacitor coupled between the positive terminals of the first and second VVCs and the first and second terminals of the resonator element, respectively.

7. A reference oscillator, comprising:

an amplifier having an input and an output; and a tuning circuit coupled to the amplifier, the tuning circuit comprising:

a resonator element having a first terminal and a second terminal coupled to the input and output of the amplifier, respectively;

first and second voltage variable capacitors (VVCs) each having a positive terminal and a negative terminal;

biasing circuitry coupled to the first and second terminals of the resonator element and the positive terminals of the first and second VVCs;

a control terminal, coupled to the first and second terminals of the resonator element and the positive terminals of the first and second VVCs, for receiving a DC voltage to control a capacitance change in the first and second VVCs, such that a nominal frequency of operation for the reference oscillator is set by said DC voltage; and a modulation bias circuit coupled to the negative terminals of the first and second VVCs, and having a input for receiving a frequency modulation signal for frequency modulating the reference oscillator.

8. A reference oscillator as defined in claim 7, wherein the negative terminal of the first and second VVCs are coupled to ground potential, and the biasing circuit comprises:

a first resistor and a second resistor coupled in series between the positive terminals of the first and second VVCs, the control terminal being located between the first resistor and the second resistor; and a first DC blocking capacitor and a second DC blocking capacitor coupled between the positive terminals of the first and second VVCs and the first and second terminals of the resonator element, respectively.

* * * * *